(12) United States Patent
Liu et al.

(10) Patent No.: US 10,883,670 B1
(45) Date of Patent: Jan. 5, 2021

(54) LIGHT GUIDE MODULE AND LIGHT SOURCE MODULE

(71) Applicant: CHAMP VISION DISPLAY INC., Miaoli County (TW)

(72) Inventors: Chin-Ku Liu, Miao-Li County (TW); Hsin-Hung Lee, Miao-Li County (TW); Chung-Hao Wu, Miao-Li County (TW)

(73) Assignee: CHAMP VISION DISPLAY INC., Miaoli County (TW)

( * ) Notice: Subject to any disclaimer, the term of this patent is extended or adjusted under 35 U.S.C. 154(b) by 0 days.

(21) Appl. No.: 16/547,618

(22) Filed: Aug. 22, 2019

(51) Int. Cl.
*F21K 9/61* (2016.01)
*F21K 9/68* (2016.01)
*H01L 33/60* (2010.01)
*H01L 27/15* (2006.01)

(52) U.S. Cl.
CPC ............... *F21K 9/61* (2016.08); *F21K 9/68* (2016.08); *H01L 27/153* (2013.01); *H01L 33/60* (2013.01)

(58) Field of Classification Search
CPC .... G02B 6/0036; G02B 6/006; G02B 6/0038; F21K 9/61; F21K 9/68
See application file for complete search history.

(56) References Cited

U.S. PATENT DOCUMENTS

| 2012/0188792 | A1* | 7/2012 | Matsumoto | G02B 6/0036 362/613 |
| 2013/0070482 | A1* | 3/2013 | Miyazaki | G02B 6/0038 362/624 |
| 2015/0235508 | A1* | 8/2015 | Shinohara | G07F 17/3211 463/31 |
| 2016/0306097 | A1* | 10/2016 | Fujita | G09G 3/003 |
| 2019/0353837 | A1* | 11/2019 | Shinohara | G02B 30/34 |
| 2019/0361164 | A1* | 11/2019 | Jo | G02B 6/0065 |

FOREIGN PATENT DOCUMENTS

| JP | 2006075362 | 3/2006 |
| TW | I350395 | 10/2011 |

* cited by examiner

*Primary Examiner* — Julie A Bannan
(74) *Attorney, Agent, or Firm* — JCIPRNET

(57) ABSTRACT

A light guide module and a light source module are provided. The light guide module includes a light guide plate (LGP) and a first reflective component. The LGP includes a plate body and first microstructures. The plate body has a first light incident surface, a first side surface and a first surface connected thereto. The first microstructures are located on the first surface, and each of the first microstructures has a first optical surface facing the first side surface and the first microstructures are arranged in a first microstructure pattern. The first reflective component is located beside the first side surface, wherein the first microstructures are adapted to cause a light beam reflected by the first reflective component to present a first pattern through the first optical surfaces.

18 Claims, 10 Drawing Sheets

LIGHT GUIDE MODULE AND LIGHT SOURCE MODULE

BACKGROUND

Technical Field

The invention relates to a light guide module and a light source module, and particularly relates to a light guide plate having a plurality of microstructures and a light source module using the same.

Description of Related Art

At present, light source modules are mainly divided into side type light source modules and direct type light source modules. The side type light source module uses a Light Guide Plate (LGP) to guide light emitted by a light source disposed at a light incident side of the LGP to a light emitting surface of the LGP, so as to form a planar light source. Generally, optical microstructures used for displaying a specific pattern may be formed on a surface of the LGP, so as to form an illumination device having a pattern lighting effect.

Generally, in order to present a double-pattern lighting effect in the illumination device, a conventional method is to configure multiple microstructures on the surface of the LGP to respectively extend along horizontal and vertical directions for corresponding to the light sources emitting light in the vertical and horizontal directions respectively, and then use a light source switch to control the light sources so as to present the corresponding pattern individually. To be more specific, if the microstructures extending along the horizontal direction are used for presenting a pattern A, when the corresponding light source emitting the light in the vertical direction is turned on, the illumination device may present the pattern A. If the microstructures extending along the vertical direction are used for presenting a pattern B, when the corresponding light source emitting the light in the horizontal direction is turned on, the illumination device may present the pattern B. However, since the light source used in the light source module is a plurality of point light sources (e.g., the LEDs), the light from the light source will also have high directivity after being reflected by the microstructures, consequently the spacing between the LEDs will cause a line-like hot spot phenomenon, which affects the image quality of the patterns.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY

The invention is directed to a light guide module, which is adapted to reduce a hot spot phenomenon.

The invention is directed to a light source module, which is capable of providing images of patterns with good image quality.

Other objects and advantages of the invention may be further illustrated by the technical features broadly embodied and described as follows.

In order to achieve one or a portion of or all of the objects or other objects, an embodiment of the invention provides a light guide module. The light guide module includes a light guide plate (LGP) and a first reflective component. The LGP includes a plate body and first microstructures. The plate body has a first light incident surface, a first side surface, and a first surface, wherein the first light incident surface and the first side surface are opposite to each other and the first surface is connected to the first light incident surface and the first side surface. The first microstructures are located on the first surface. Each of the first microstructures has a first optical surface and a third optical surface. The first optical surface faces the first side surface, and the third optical surface faces the first light incident surface. There is a first included angle between the first optical surface and the first surface. There is a third included angle between the third optical surface and the first surface. The first microstructures are arranged in a first microstructure pattern. The first reflective component is located beside the first side surface, wherein the first microstructures are adapted to cause a light beam reflected by the first reflective component to present a first pattern through the first optical surfaces.

In order to achieve one or a portion of or all of the objects or other objects, an embodiment of the invention provides a light source module. The light source module includes the aforementioned light guide module and a first light source. The first light source is located beside the first light incident surface of the plate body of the light guide plate, wherein the first light source is configured to provide a first light beam, and the first light beam enters the light guide plate through the first light incident surface and presents a first pattern through the first optical surfaces of the first microstructures arranged in the first microstructure pattern after being reflected by the first reflective component.

Based on the above description, the embodiments of the invention have at least one of following advantages or effect. In the embodiment of the invention, the light source module and the light guide module of the invention are adapted to enable the light source to cause the plurality of point light-emitting elements to form a uniform line light source based on the configuration of the first reflective component, and therefore the light reflected by the first reflective component could be incident to the first optical surface and then guided by the first optical surface to be emitted out of the light guide plate so as to display a pattern based on the configuration of the first optical surface facing the first reflective component. In this way, the light guide module of the invention is adapted to reduce a hot spot phenomenon, and the light source module of the invention is capable of providing images of patterns with good image quality.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
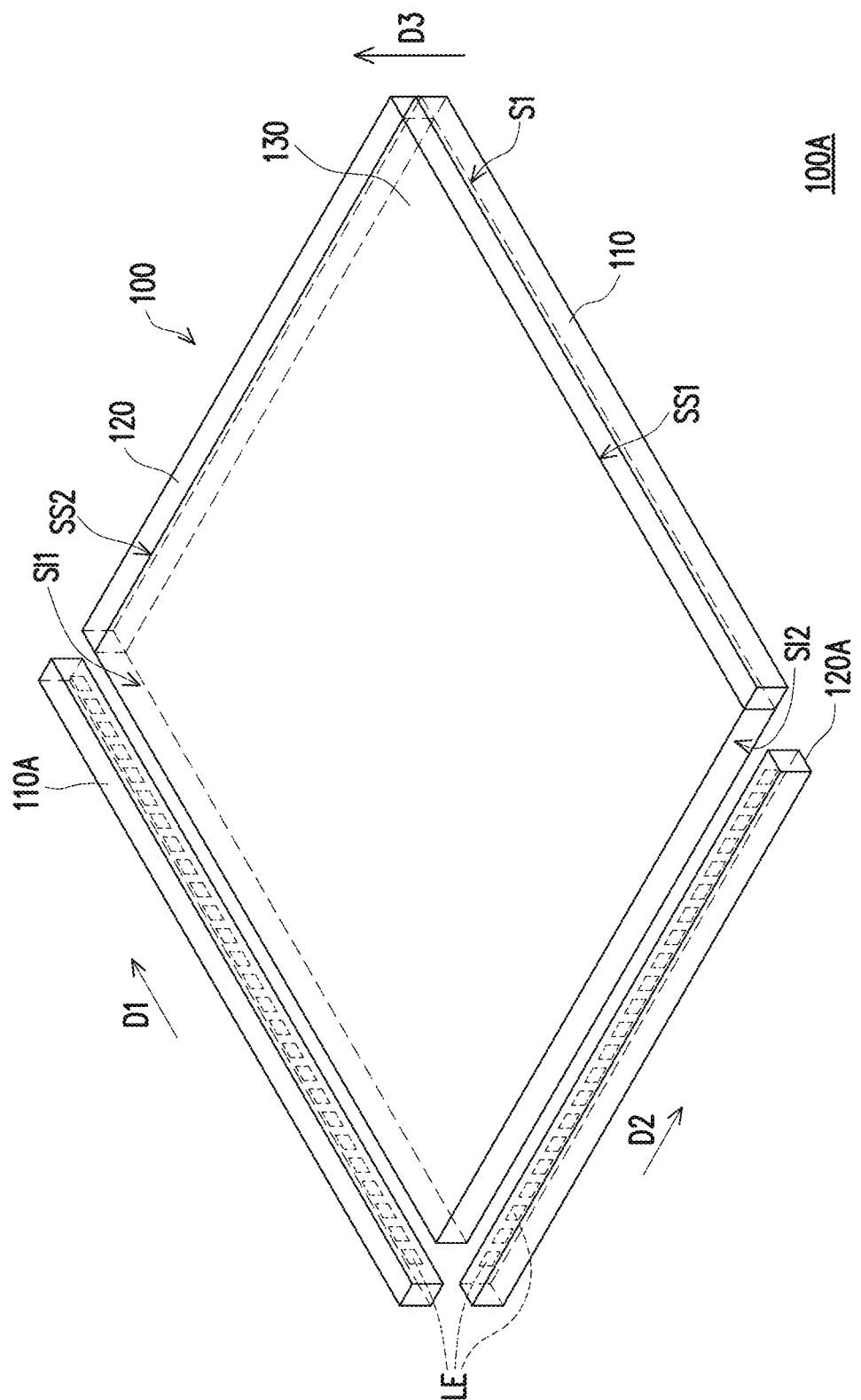
FIG. 1 is a schematic diagram of a framework of a light source module according to an embodiment of the invention.
Figure 2:
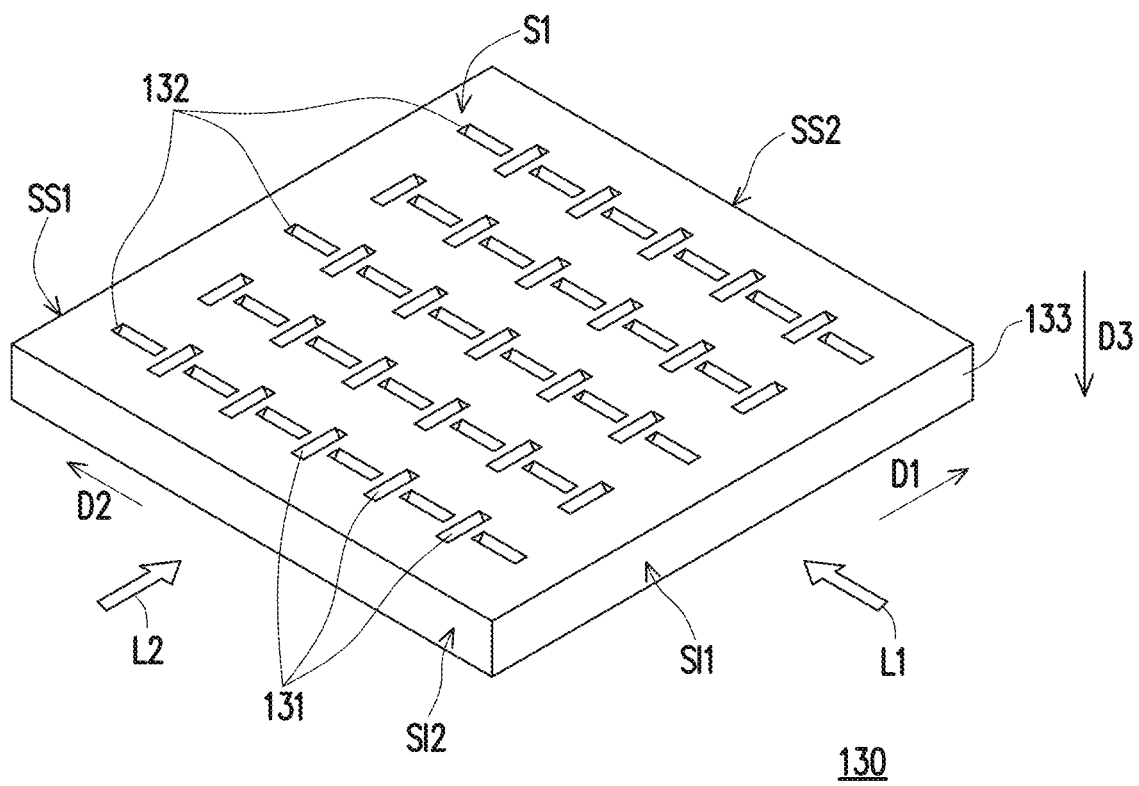
FIG. 2 is a schematic bottom view of a light guide plate of FIG. 1.

FIG. 1 is a schematic diagram of a framework of a light source module according to an embodiment of the invention. FIG. 2 is a schematic bottom view of a light guide plate of FIG. 1. Referring to FIG. 1 and FIG. 2, the light source module 100A of the embodiment includes a light guide module 100, a first light source 110A and a second light source 120A. For example, in the embodiment, the first light source 110A and the second light source 120A may be light bars including a plurality of Light Emitting Diode (LED) elements LE or other types of light emitting elements used for providing light beams. Moreover, when the light source module 100A switches the first light source 110A to a turn-on state and switches the second light source 120A to a turn-off state, the light source module 100A is used for displaying a first pattern, and when the light source module 100A switches the second light source 120A to the turn-on state and switches the first light source 110A to the turn-off state, the light source module 100A is used for displaying a second pattern.

To be specific, referring to FIG. 1 and FIG. 2, in the embodiment, the light guide module 100 includes a light guide plate 130 (LGP) and a first reflective component 110. The light guide plate 130 includes a plate body 133, a plurality of first microstructures 131 and a plurality of second microstructures 132. The plate body 133 has a first light incident surface SI1, a first side surface SS1, a second light incident surface SI2 and a second side surface SS2, and a first surface S1. The first light incident surface SI1 is adjacent to the second light incident surface SI2. The first light incident surface SI1 and the first side surface SS1 are opposite to each other, and the first surface S1 is connected to the first light incident surface SI1 and the first side surface SS1. The second light incident surface SI2 and the second side surface SS2 are opposite to each other, and the first surface S1 is connected to the second light incident surface SI2 and the second side surface SS2.

To be specific, referring to FIG. 1 to FIG. 2, in the embodiment, the first microstructures 131 extend along a first direction D1, the second microstructures 132 extend along a second direction D2, and a normal direction of the plate body 133 is defined as a third direction D3, and the first microstructures 131 and the second microstructures 132 are all located on the first surface S1. For example, in the embodiment, the first surface S1 is, for example, a bottom surface of the plate body 133. Namely, as shown in FIG. 2, in the embodiment, the first microstructures 131 and the second microstructures 132 are all located on the bottom surface of the plate body 133, though the invention is not limited thereto. In other embodiments, the first surface S1 may also be an upper surface of the plate body 133, i.e. the first microstructures 131 and the second microstructures 132 may also be located on the upper surface of the plate body 133.

Figure 3A:
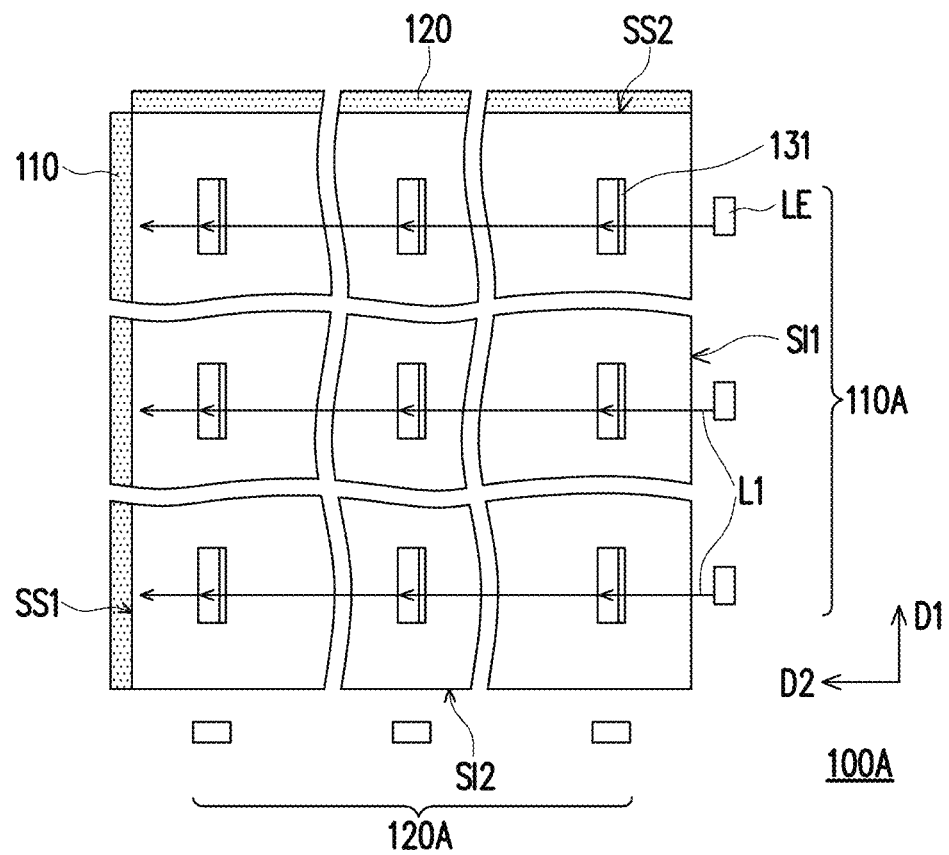
FIG. 3A is a schematic bottom view of an optical path of light incident to a first microstructure of FIG. 2.
Figure 3B:
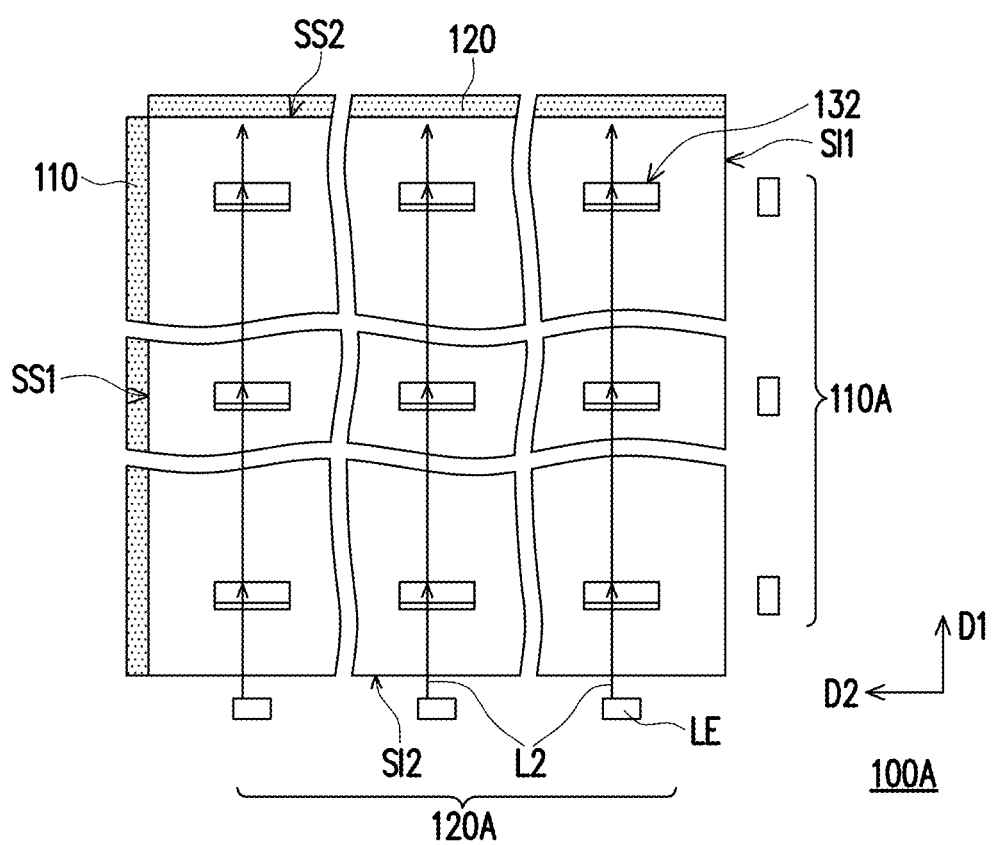
FIG. 3B is a schematic bottom view of an optical path of light incident to a second microstructure of FIG. 2.
Figure 3C:
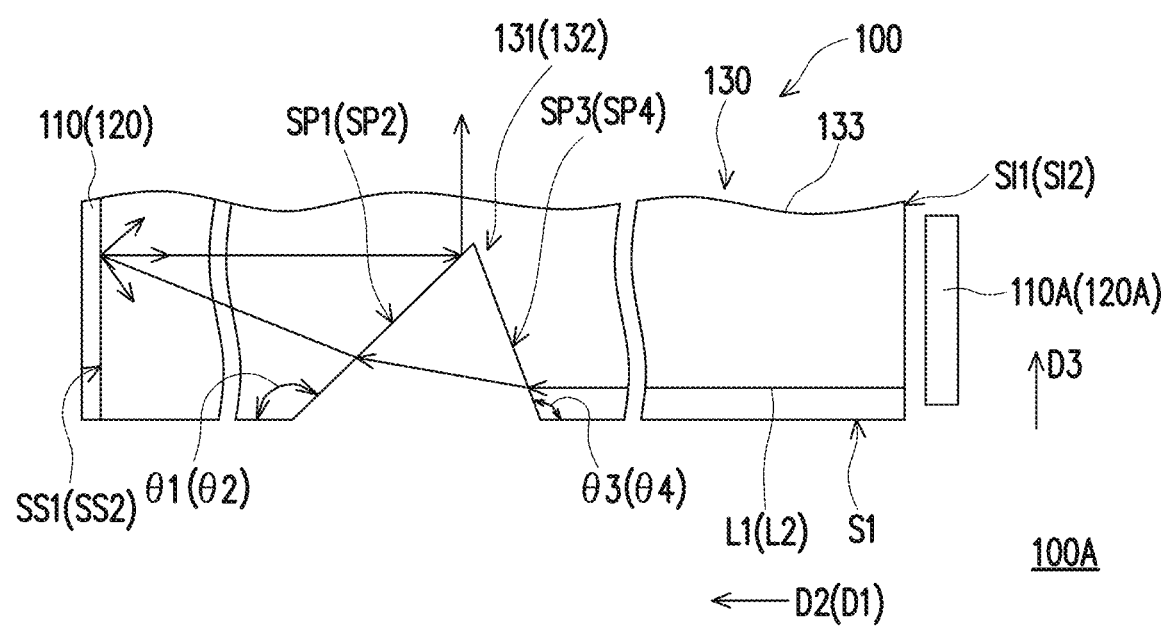
FIG. 3C is a schematic side view of an optical path of light incident to the first microstructure or the second microstructure of FIG. 2 according to one embodiment of the invention.

FIG. 3A is a schematic bottom view of an optical path of light incident to a first microstructure of FIG. 2. FIG. 3B is a schematic bottom view of an optical path of light incident to a second microstructure of FIG. 2. FIG. 3C is a schematic side view of an optical path of light incident to the first microstructure or the second microstructure of FIG. 2 according to one embodiment of the invention. It should be noted that although the extending directions of the first microstructures 131 and the second microstructures 132 disposed on the first surface S1 are different, regarding a single first microstructure 131 and a single second microstructure 132, limitation ranges in structural design may be regarded as the same. In order to avoid lengthy description, in FIG. 3C, the first microstructure 131 and the second microstructure 132 are integrated into the same figures for description. Moreover, when the first microstructure 131 is described, FIG. 3C may be regarded as cross-sections of the first microstructure 131 cut along the second direction D2 of FIG. 2, and when the second microstructure 132 is described, FIG. 3C may be regarded as cross-sections of the second microstructure 132 cut along the first direction D1 of FIG. 2. Referring to FIG. 2, FIG. 3A and FIG. 3B, in the embodiment, the second direction D2 is substantially perpendicular to the first direction D1, i.e. an extending direction of the first microstructures 131 is substantially perpendicular to an extending direction of the second microstructures 132. To be specific, as shown in FIG. 2, FIG. 3A and FIG. 3C, in the embodiment, each of the first microstructures 131 has a first optical surface SP1 and a third optical surface SP3. The first optical surface SP1 faces the first side surface SS1, and the third optical surface SP3 faces the first light incident surface SI1. There is a first included angle θ1 between the first optical surface SP1 and the first surface S1. There is a third included angle θ3 between the third optical surface SP3 and the first surface S1. The first microstructures 131 are arranged in a first microstructure pattern.

Moreover, as shown in FIG. 1 and FIG. 2, the first light source 110A is located beside the first light incident surface SI1 of the plate body 133 of the light guide plate 130, and the first reflective component 110 is located beside the first side surface SS1. For example, in this embodiment, the first reflective component 110 may be a reflective sheet or a reflective coating or the like, and the first reflective component 110 may be in contact with the light guide plate 130. However, the invention is not limited thereto. In other embodiments, the first reflective component 110 may also be a reflective sheet, and there may be a gap formed between the reflective sheet and the light guide plate 130.

When the light source module 100A switches the first light source 110A to the turn-on state, the first light source 110A provides a first light beam L1, and the first light beam L1 may enter the light guide plate 130 through the first light incident surface SI1. As shown in FIG. 2, FIG. 3A and FIG. 3C, in the embodiment, after the first light beam L1 enters the light guide plate 130 through the first light incident surface SI1, the first light beam L1 may be transmitted in the plate body 133 and reflected by the first reflective component 110 so as to enable the light source to cause the plurality of point light-emitting elements to form a uniform line light source. Therefore, the first light beam L1 reflected by the first reflective component 110 could be incident to the first optical surface SP1 and then guided by the first optical surface SP1 to be emitted out of the light guide plate 130. In this way, the light source module 100A may display the first pattern required by the lighting effect through an arrangement of the first microstructures 131.

Similarly, as shown in FIG. 2, FIG. 3B and FIG. 3C, in the embodiment, each of the second microstructures 132 has a second optical surface SP2 and a fourth optical surface SP4, wherein the second optical surface SP2 faces the second side surface SS2, and the fourth optical surface SP4 faces the second light incident surface SI2. There is a second included angle θ2 between the second optical surface SP2 and the first surface S1. There is a fourth included angle θ4 between the fourth optical surface SP4 and the first surface S1. The second microstructures 132 are arranged in a second microstructure pattern.

Moreover, as shown in FIG. 1 and FIG. 2, the second light source 120A is located beside the second light incident surface SI2 of the plate body 133 of the light guide plate 130, and the second reflective component 120 is located beside the second side surface SS2. For example, in this embodiment, the second reflective component 120 may be a reflective sheet or a reflective coating or the like, and the second reflective component 120 may be in contact with the light guide plate 130. However, the invention is not limited thereto. In other embodiments, the second reflective component 120 may also be a reflective sheet, and there may be a gap formed between the reflective sheet and the light guide plate 130.

When the light source module 100A switches the second light source 120A to the turn-on state, the second light source 120A provides the second light beam L2, the second light beam L2 may enter the light guide plate 130 through the second light incident surface SI2. As shown in FIG. 2, FIG. 3B and FIG. 3C, in the embodiment, after the second light beam L2 enters the light guide plate 130 through the second light incident surface SI2, the second light beam L2 may be transmitted in the plate body 133 and reflected by the second reflective component 120 so as to enable the light source to cause the plurality of point light-emitting elements to form a uniform line light source. Therefore, the second light beam L2 reflected by the second reflective component 120 could be incident to the second optical surface SP2 and then guided by the second optical surface SP2 to be emitted out of the light guide plate 130. In this way, the light source module 100A may display the second pattern required by the lighting effect through an arrangement of the second microstructures 132.

To be specific, referring to FIG. 3A and FIG. 3C, in the embodiment, each of the first microstructures 131 is a prism type microstructure. Referring to FIG. 2, FIG. 3A and FIG. 3C, the first optical surface SP1 is connected to the third optical surface SP3 and the first surface S1, and the first optical surface SP1 and the third optical surface SP3 are inclined relative to the first surface S1. A first included angle θ1 is an included angle between the first optical surface SP1 and the first surface S1. A third included angle θ3 is an included angle between the third optical surface SP3 and the first surface S1. To be specific, as shown in FIG. 3C, in the embodiment, when each of the first microstructures 131 is recessed into the first surface S1, the first included angle θ1 is greater than the third included angle θ3. For example, the first included angle θ1 is greater than or equal to 120 degrees and smaller than or equal to 150 degrees. In this situation, the first light beam L1 can be emitted forward through the first optical surface SP1. Moreover, in the case where the above conditions are satisfied, the third included angle θ3 is, for example, greater than or equal to 90 degrees and smaller than or equal to 135 degrees.

On the other hand, similarly, in the embodiment, each of the second microstructures 132 is also a prism type microstructure, which has a structural design similar to that of the first microstructure 131. To be specific, referring to FIG. 2, FIG. 3B and FIG. 3C, in the embodiment, the second optical surface SP2 is connected to the fourth optical surface SP4 and the first surface S1, and the second optical surface SP2 and the fourth optical surface SP4 are inclined relative to the first surface S1. A second included angle θ2 is an included angle between the second optical surface SP2 and the first surface S1. A fourth included angle θ4 is an included angle between the fourth optical surface SP4 and the first surface S1. To be specific, as shown in FIG. 3C, in the embodiment, when each of the second microstructures 132 is recessed into the first surface S1, the second included angle θ2 is greater than the fourth included angle θ4. For example, the second included angle θ2 is greater than or equal to 120 degrees and smaller than or equal to 150 degrees. In this situation, the second light beam L2 can be emitted forward through the second optical surface SP2. Moreover, in the case where the above conditions are satisfied, the fourth included angle θ4 is, for example, greater than or equal to 90 degrees and smaller than or equal to 135 degrees.

In this way, based on the configuration of the first reflective component 110 (or the second reflective component 120), the light source module 100A and the light guide module 100 are adapted to enable the light source to cause the plurality of point light-emitting elements to form a uniform line light source. Therefore, the light reflected by the first reflective component 110 (or the second reflective component 120) could be incident to the first optical surface SP1 (or the second optical surface SP2) and then guided by the first optical surface SP1 (or the second optical surface SP2) to be emitted out of the light guide plate 130 so as to display a first pattern (or the second pattern) based on the configuration of the first optical surface SP1 (or the second optical surface SP2) facing the first reflective component 110 (or the second reflective component 120). In this way, the light guide module 100 of the invention is adapted to reduce a hot spot phenomenon, and the light source module 100A of the invention is capable of providing images of patterns with good image quality.

Figure 4A:
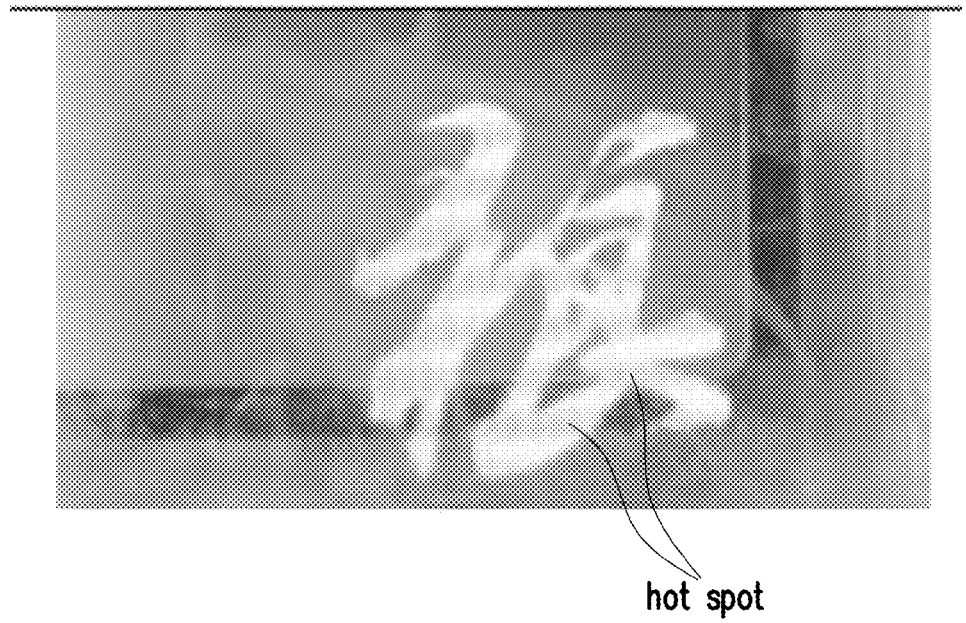
FIG. 4A and FIG. 4B are schematic diagrams of a pattern presented by a comparative example and the light source module of FIG. 1 of the invention.
Figure 4B:

FIG. 4A and FIG. 4B are schematic diagrams of a pattern presented by a comparative example and the light source module 100A of FIG. 1 of the invention. Referring to FIG. 4A and FIG. 4B, the pattern presented in the embodiment of FIG. 4A is represented by a light source module similar to the light source module 100A of FIG. 1, but the light source module adopted by the comparative example of FIG. 4A lacks the first reflective component 110 (or the second reflective component 120). On the other hand, the pattern presented in the embodiment of FIG. 4B is presented by the light source module 100A of FIG. 1. As shown in FIG. 4A, the pattern presented by the light source module of FIG. 4A different from the light source module 100A of FIG. 1 may generate a hot spot phenomenon with distinct multiple staggered bright regions and dark regions on the light incident side (e.g., near the first incident surface or near the second incident surface). In contrast, as shown in FIG. 4B, in the embodiment, the light guide module 100 and the light source module 100A can eliminate the hot spot phenomenon on the light incident side (e.g., near the first incident surface or near the second incident surface) by the configuration of the first reflective element or the second reflective element, thereby displaying an image of the first pattern (or the second pattern) with good image quality.

On the other hand, experimental data of comparative examples are provided for comparison of the luminance gain with different configurations of the light source modules. However, the experimental data mentioned in the following is not intended to limit the disclosure. Any person skilled in the art may refer to the disclosure and make appropriate changes to parameters or settings thereof and the changes should still fall within the scope of the disclosure. To be specific, in the comparative examples, the optical surface (similar to the first optical surface SP1 of the embodiment of FIG. 3C) of the first microstructure which forms the included angle θ1 with the bottom surface (similar to the first surface S1 of the embodiment of FIG. 3C) may face the light incident surface or face the side surface opposite to the light incident surface, and the included angle θ1 may be greater than or equal to 120 degrees and smaller than or equal to 150 degrees. In the condition that the optical surface faces the light incident surface, the luminance gain of the light source module configured to form the image of the first pattern is 1.68 when comparing the comparative example with reflective component located beside the side surface to the comparative example without reflective component located beside the side surface. In the condition that the optical surface faces the side surface, the luminance gain of the light source module configured to form the image of the first pattern is 2.89 when comparing the comparative example with reflective component located beside the side surface to the comparative example without reflective component located beside the side surface.

Furthermore, in the other comparative examples, the optical surface (similar to the second optical surface SP2 of the embodiment of FIG. 3C) of the second microstructure which forms the included angle θ2 with the bottom surface (similar to the first surface S1 of the embodiment of FIG. 3C) may face the light incident surface or face the side surface opposite to the light incident surface, and the included angle θ2 may be greater than or equal to 120 degrees and smaller than or equal to 150 degrees. In the condition that the optical surface faces the light incident surface, the luminance gain of the light source module configured to form the image of the second pattern is 2.17 when comparing the comparative example with reflective component located beside the side surface to the comparative example without reflective component located beside the side surface. In the condition that the optical surface faces the side surface, the luminance gain of the light source module configured to form the image of the second pattern is 2.64 when comparing the comparative example with reflective component located beside the side surface to the comparative example without reflective component located beside the side surface.

That is, when the optical surface of each of the microstructures faces the side surface and the reflective component is located beside the side surface, the optical surface is configured to face the reflective component and the luminance of the light source module would be effectively increased. Therefore, adopting the configuration that the optical surface faces the reflective component and the included angle between the optical surface and the bottom surface may be greater than or equal to 120 degrees and smaller than or equal to 150 degrees can contribute to the improvement of the luminance of the light source module.

Moreover, it should be noted that in the aforementioned embodiment, the first microstructures 131 and the second microstructures 132 are all recessed relative to the first surface S1, for example, the bottom surface, of the plate body 133, though the invention is not limited thereto, and in other embodiments, the first microstructures 131 and the second microstructures 132 may also be protruded relative to the first surface S1 of the plate body 133 as long as the first optical surfaces SP1 of the first microstructures 131 and the second optical surfaces SP2 of the second microstructures 132 respectively face the first reflective component 110 and the second reflective component 120, and may be used for displaying the first pattern or the second pattern required by the lighting effect. Further description is made below with reference of FIG. 5.

Figure 5:
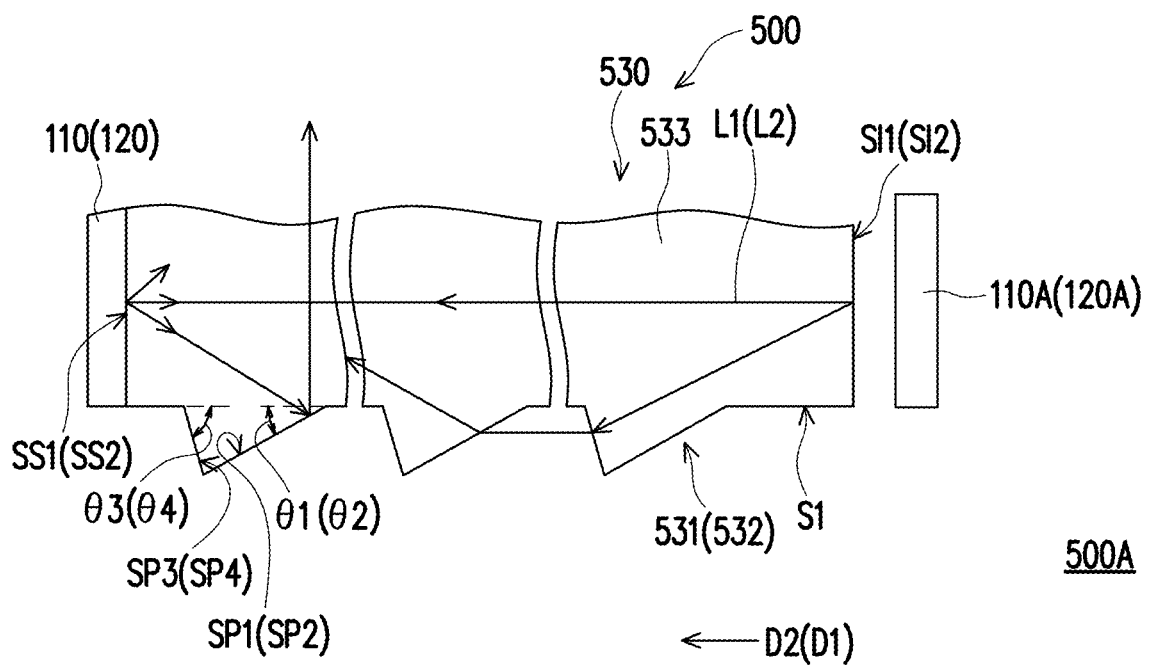
FIG. 5 is a schematic side view of optical paths of light incident to the first microstructure or the second microstructure according to another embodiment of the invention.

FIG. 5 is a schematic side view of optical paths of light incident to the first microstructure or the second microstructure according to another embodiment of the invention. It should be noted that for simplicity's sake, in FIG. 5, the first microstructure 531 and the second microstructure 532 are integrated into the same figure for description. Moreover, when the first microstructure 531 is described, FIG. 5 may be regarded as cross-sections of the first microstructure 531 cut along the second direction D2 of FIG. 2, and when the second microstructure 532 is described, FIG. 5 may be regarded as cross-sections of the second microstructure 532 cut along the first direction D1 of FIG. 2. Referring to FIG. 5, the first microstructures 531 and the second microstructures 532 of the light guide plate 530 of the embodiment are respectively similar to the first microstructures 531 and the second microstructures 532 of the light guide plate 530 of FIG. 3C, and differences between them are as follows.

In the embodiment of FIG. 5, each of the first microstructures 531 and each of the second microstructures 532 are protruded out from the first surface S1, and the first included angle θ1 is smaller than the third included angle θ3 and the second included angle θ2 is smaller than the fourth included angle θ4. For example, the first included angle θ1 is greater than or equal to 30 degrees and smaller than or equal to 60 degrees. In this situation, the first light beam L1 can be emitted forward through the first optical surface SP1. Moreover, in the case where the above conditions are satisfied, the third included angle θ3 is, for example, greater than or equal to 45 degrees and smaller than or equal to 90 degrees. And similarly, the second included angle θ2 is, for example, greater than or equal to 30 degrees and smaller than or equal to 60 degrees. In this situation, the second light beam L2 can be emitted forward through the second optical surface SP2. Moreover, in the case where the above conditions are satisfied, the fourth included angle θ4 is, for example, greater than or equal to 45 degrees and smaller than or equal to 90 degrees.

In this way, as shown in FIG. 5, in the light source module 500A and the light guide module 500 using the first microstructures 531 and the second microstructures 532 of the light guide plate 530, based on the configuration of the first reflective component 110 (or the second reflective component 120), the light source module 500A and the light guide module 500 are adapted to enable the light source to cause the plurality of point light-emitting elements to form a uniform line light source. Therefore, the light reflected by the first reflective component 110 (or the second reflective component 120) could be incident to the first optical surface SP1 (or the second optical surface SP2) and then guided by the first optical surface SP1 (or the second optical surface SP2) to be emitted out of the light guide plate 530 so as to display a first pattern (or the second pattern) based on the configuration of the first optical surface SP1 (or the second optical surface SP2) facing the first reflective component 110 (or the second reflective component 120). In this way, the light guide module 500 of the invention is adapted to reduce a hot spot phenomenon, and the light source module 500A of the invention is capable of providing images of patterns with good image quality.

Figure 6A:
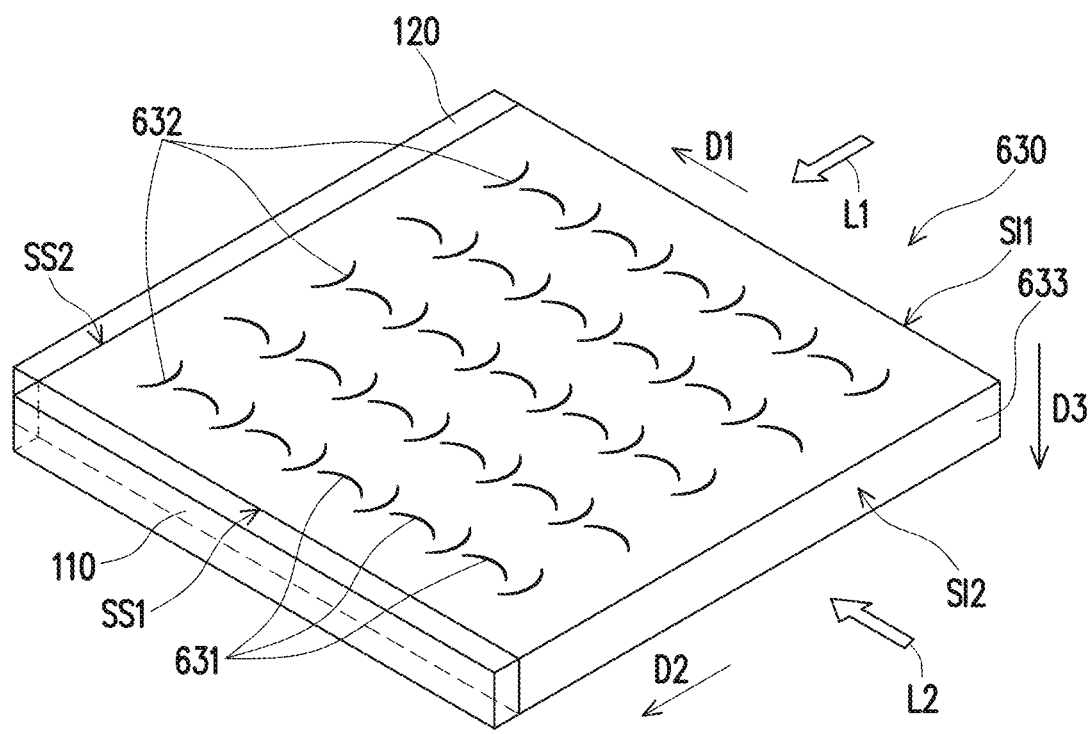
FIG. 6A is a schematic bottom view of a light guide module of FIG. 1 according to another embodiment of the invention.
Figure 6B:
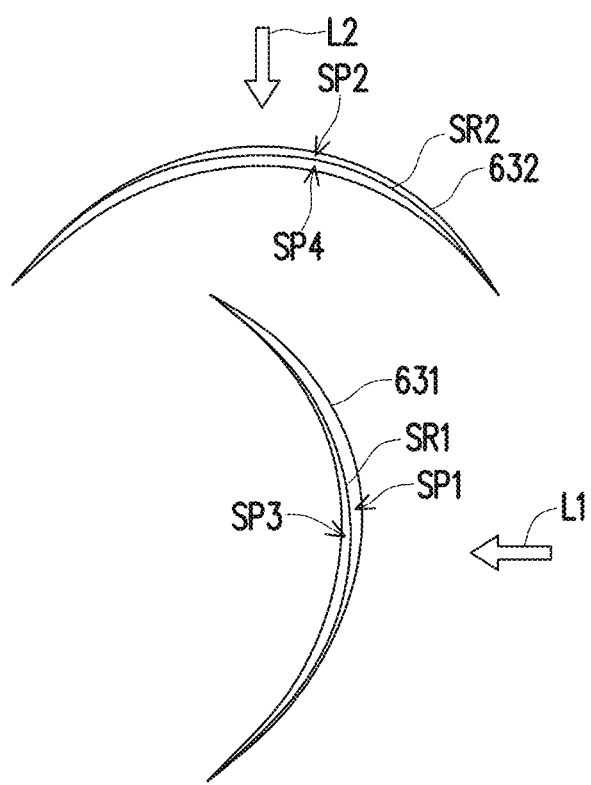
FIG. 6B is a schematic top view of an optical path of light incident to the first microstructure and the second microstructure of FIG. 6A.
Figure 6C:
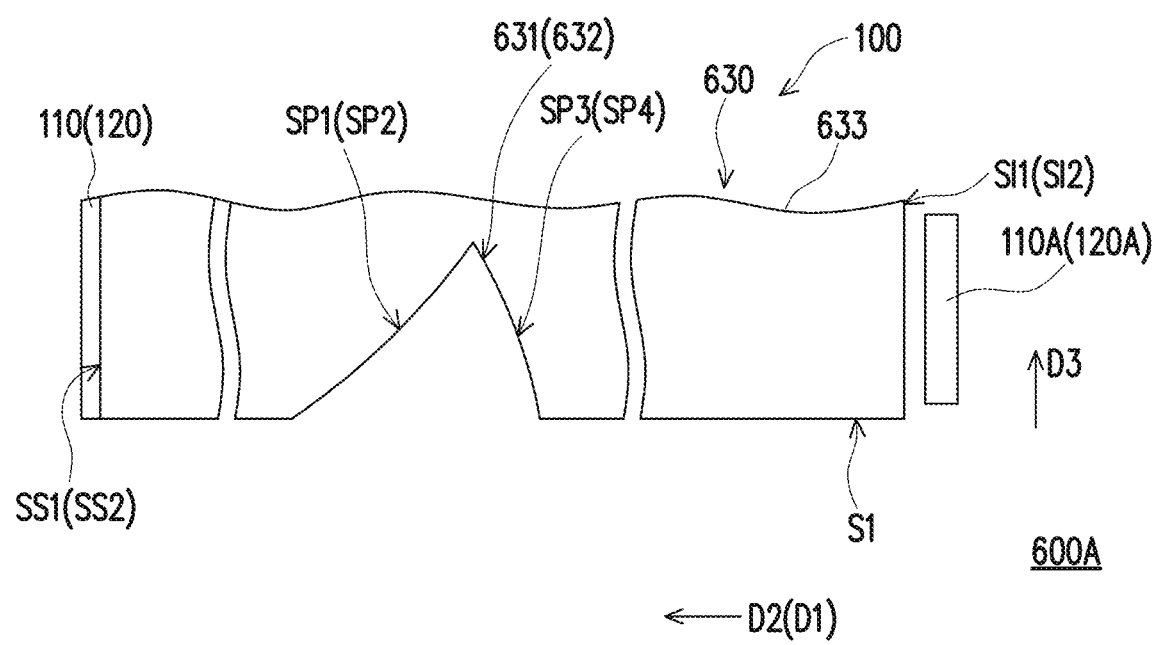
FIG. 6C is a schematic side view of the first microstructures or second microstructures of FIG. 6A.

FIG. 6A is a schematic bottom view of a light guide module of FIG. 1 according to another embodiment of the invention. FIG. 6B is a schematic top view of an optical path of light incident to the first microstructure and the second microstructure of FIG. 6A. FIG. 6C is a schematic side view of the first microstructures or second microstructures of FIG. 6A. It should be noted that although extending directions of the first microstructure 631 and the second microstructure 632 disposed on the first surface S1 of the plate body 633 are different, regarding a single first microstructure 631 and a single second microstructure 632, limitation ranges in structural design may be regarded as the same. In order to avoid lengthy description, in FIG. 6C, the first microstructure 631 and the second microstructure 632 are integrated into the same figure for description. Referring to FIG. 6A, in the embodiment, the light guide plate 630 is similar to the light guide plate 130 of FIG. 2, and differences between them are as follows. As shown in FIG. 6A to FIG. 6C, in the embodiment, the first microstructures 631 and the second microstructures 632 of the light guide plate 630 are crescent structures. Namely, the first microstructures 631 and the second microstructures 632 of the embodiment respectively have a first ridge line SR1 and a second ridge line SR2. Moreover, when the first microstructure 631 is described, FIG. 6C may be regarded as a cross-section of the first microstructure 631 cut across the first ridge line SR1 of FIG. 6B, and when the second microstructure 632 is described, FIG. 6C may be regarded as a cross-section of the second microstructure 632 cut across the second ridge line SR2 of FIG. 6B.

To be more specific, as shown in FIG. 6B, in the embodiment, the first optical surface SP1 and the third optical surface SP3 of each of the first microstructures 631 are connected with each other to form the first ridge line SR1, and similarly, the second optical surface SP2 and the fourth optical surface SP4 of each of the second microstructures 632 are connected with each other to form the second ridge line SR2. As shown in FIG. 6B, in the embodiment, the first ridge line SR1 and the second ridge line SR2 are all arc lines, and the first ridge line SR1 and the second ridge line SR2 are respectively convex toward the first light beam L1 and the second light beam L2.

In this way, as shown in FIG. 6A to FIG. 6C, in the light guide module 600 using the first microstructures 631 and the second microstructures 632 of the light guide plate 630, based on the configuration of the first reflective component 110 (or the second reflective component 120), the light guide module 600 are adapted to enable the light source to cause the plurality of point light-emitting elements to form a uniform line light source. Therefore, the light reflected by the first reflective component 110 (or the second reflective component 120) could be incident to the first optical surface SP1 (or the second optical surface SP2) and then guided by the first optical surface SP1 (or the second optical surface SP2) to be emitted out of the light guide plate 630 so as to display a first pattern (or the second pattern) based on the configuration of the first optical surface SP1 (or the second optical surface SP2) facing the first reflective component 110 (or the second reflective component 120). In this way, the light guide module 600 of the invention is adapted to reduce a hot spot phenomenon.

Therefore, when the first microstructures 631 and the second microstructures 632 of the light guide plate 630 of the light guide module 600 are applied to the light source module 100A of FIG. 1, the functions and effects of the aforementioned light source module 100A may still be achieved, and other related details are not repeated.

Moreover, it should be noted that in the aforementioned embodiment, the first microstructures 631 and the second microstructures 632 are all recessed relative to the first surface S1, for example, the bottom surface of the plate body 633, though the invention is not limited thereto, and in other embodiments, each of the first microstructures 631 and each of the second microstructures 632 may also be protruded out from the first surface S1 to form structures similar to that of FIG. 5. Moreover, when this kind of the first microstructures 631 and second microstructures 632 are applied to the light guide plate 630 of FIG. 6A, the functions and effects of the aforementioned first microstructures 631 and the aforementioned second microstructures 632 of FIG. 6A to FIG. 6C may still be achieved, and other related details are not repeated.

In summary, the embodiments of the invention have at least one of following advantages or effect. In the embodiment of the invention, the light source module and the light guide module of the invention are adapted to enable the light source to cause the plurality of point light-emitting elements to form a uniform line light source based on the configuration of the first reflective component, and therefore the light reflected by the first reflective component could be incident to the first optical surface and then guided by the first optical surface to be emitted out of the light guide plate so as to display a pattern based on the configuration of the first optical surface facing the first reflective component. In this way, the light guide module of the invention is adapted to reduce a hot spot phenomenon, and the light source module of the invention is capable of providing images of patterns with good image quality.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the present disclosure is intended to be dedicated to the public regardless of whether the element or component is explicitly recited in the following claims.

What is claimed is:

1. A light guide module, comprising:
    a light guide plate, comprising:
        a plate body, having a first light incident surface, a first side surface, a first surface, a second light incident surface and a second side surface, wherein the first light incident surface and the first side surface are opposite to each other, the first surface is connected to the first light incident surface and the first side surface, the second light incident surface and the second side surface are opposite to each other, the first light incident surface is adjacent to the second light incident surface, and the first surface is connected to the second light incident surface and the second side surface;
        a plurality of first microstructures, located on the first surface, wherein each of the first microstructures has a first optical surface and a third optical surface, the first optical surface faces the first side surface, the third optical surface faces the first light incident surface, there is a first included angle between the first optical surface and the first surface, there is a third included angle between the third optical surface and the first surface, and the first microstructures are arranged in a first microstructure pattern; and
        a plurality of second microstructures, located on the first surface, wherein each of the second microstructures has a second optical surface and a fourth optical surface, the second optical surface faces the second side surface, the fourth optical surface faces the second light incident surface, there is a second included angle between the second optical surface and the first surface, there is a fourth included angle between the fourth optical surface and the first surface, and the second microstructures are arranged in a second microstructure pattern;
    a first reflective component, located beside the first side surface, wherein the first microstructures are adapted to cause a light beam reflected by the first reflective component to present a first pattern through the first optical surfaces; and
    a second reflective component, located beside the second side surface, wherein the second microstructures are adapted to cause a light beam reflected by the second reflective component to present a second pattern through the second optical surfaces.

2. The light guide module as claimed in claim 1, wherein each of the first microstructures and each of the second microstructures are recessed into the first surface.

3. The light guide module as claimed in claim 2, wherein the first included angle is greater than the third included angle and the second included angle is greater than the fourth included angle.

4. The light guide module as claimed in claim 3, wherein the first included angle is greater than or equal to 120 degrees and smaller than or equal to 150 degrees, and the second included angle is greater than or equal to 120 degrees and smaller than or equal to 150 degrees.

5. The light guide module as claimed in claim 1, wherein each of the first microstructures and each of the second microstructures are protruded from the first surface.

6. The light guide module as claimed in claim 5, wherein the first included angle is smaller than the third included angle and the second included angle is smaller than the fourth included angle.

7. The light guide module as claimed in claim 6, wherein the first included angle is greater than or equal to 30 degrees and smaller than or equal to 60 degrees, and the second included angle is greater than or equal to 30 degrees and smaller than or equal to 60 degrees.

8. The light guide module as claimed in claim 1, wherein the second optical surface and the fourth optical surface of each of the second microstructures are connected to each other to form a second ridge line, the second ridge line is an arc line.

9. The light guide module as claimed in claim 1, wherein the first optical surface and the third optical surface of each of the first microstructures are connected to each other to form a first ridge line, the first ridge line is an arc line.

10. A light source module, comprising:
a light guide module, comprising:
a light guide plate, comprising:
a plate body, having a first light incident surface, a first side surface, a first surface, a second light incident surface and a second side surface, wherein the first light incident surface and the first side surface are opposite to each other, the first surface is connected to the first light incident surface and the first side surface, the second light incident surface and the second side surface are opposite to each other, the first light incident surface is adjacent to the second light incident surface, and the first surface is connected to the second light incident surface and the second side surface;
a plurality of first microstructures, located on the first surface, wherein each of the first microstructures has a first optical surface and a third optical surface, the first optical surface faces the first side surface, the third optical surface faces the first light incident surface, there is a first included angle between the first optical surface and the first surface, there is a third included angle between the third optical surface and the first surface, and the first microstructures are arranged in a first microstructure pattern; and
a plurality of second microstructures, located on the first surface, wherein each of the second microstructures has a second optical surface and a fourth optical surface, the second optical surface faces the second side surface, the fourth optical surface faces the second light incident surface, there is a second included angle between the second optical surface and the first surface, there is a fourth included angle between the fourth optical surface and the first surface, and the second microstructures are arranged in a second microstructure pattern;
a first reflective component, located beside the first side surface; and
a second reflective component, located beside the second side surface;
a first light source, located beside the first light incident surface of the plate body of the light guide plate, wherein the first light source is configured to provide a first light beam, the first light beam enters the light guide plate through the first light incident surface and presents a first pattern through the first optical surfaces of the first microstructures arranged in the first microstructure pattern after being reflected by the first reflective component; and
a second light source, located beside the second light incident surface of the plate body of the light guide plate, wherein the second light source is configured to provide a second light beam, the second light beam enters the light guide plate through the second light incident surface and present a second pattern through the second optical surfaces of the second microstructures arranged in the second microstructure pattern after being reflected by the second reflective component.

11. The light source module as claimed in claim 10, wherein each of the first microstructures and each of the second microstructures are recessed into the first surface.

12. The light source module as claimed in claim 11, wherein the first included angle is greater than the third included angle and the second included angle is greater than the fourth included angle.

13. The light source module as claimed in claim 12, wherein the first included angle is greater than or equal to 120 degrees and smaller than or equal to 150 degrees, and the second included angle is greater than or equal to 120 degrees and smaller than or equal to 150 degrees.

14. The light source module as claimed in claim 10, wherein each of the first microstructures and each of the second microstructures are protruded from the first surface.

15. The light source module as claimed in claim 14, wherein the first included angle is smaller than the third included angle and the second included angle is smaller than the fourth included angle.

16. The light source module as claimed in claim 15, wherein the first included angle is greater than or equal to 30 degrees and smaller than or equal to 60 degrees, and the second included angle is greater than or equal to 30 degrees and smaller than or equal to 60 degrees.

17. The light source module as claimed in claim 10, wherein the second optical surface and the fourth optical surface of each of the second microstructures are connected to each other to form a second ridge line, the second ridge line is an arc line.

18. The light source module as claimed in claim 10, wherein the first optical surface and the third optical surface of each of the first microstructures are connected to each other to form a first ridge line, the first ridge line is an arc line.

* * * * *